(12) United States Patent
Ichikawa et al.

(10) Patent No.: US 6,248,669 B1
(45) Date of Patent: *Jun. 19, 2001

(54) METHOD FOR MANUFACTURING A SEMICONDUCTOR DEVICE

(75) Inventors: Toshihiko Ichikawa; Hiroshi Ogawa, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,039

(22) Filed: Apr. 29, 1999

(30) Foreign Application Priority Data

May 1, 1998 (JP) ................................... 10-122321

(51) Int. Cl.$^7$ ..................................... H01L 21/00
(52) U.S. Cl. ................... 438/717; 438/725; 438/736; 438/738
(58) Field of Search ................... 438/717, 725, 438/736, 738

(56) References Cited

U.S. PATENT DOCUMENTS 4,543,707 * 10/1985 Ito et al. ............................. 438/738

FOREIGN PATENT DOCUMENTS

| 8-83786 | 3/1996 | (JP) . |
| 8-162460 | 6/1996 | (JP) . |
| 8-172039 | 7/1996 | (JP) . |
| 9-211870 | 8/1997 | (JP) . |
| 9-258454 | 10/1997 | (JP) . |
| 9-260246 | 10/1997 | (JP) . |
| 11-31650 | 2/1999 | (JP) . |
| 11-97442 | 4/1999 | (JP) . |

* cited by examiner

Primary Examiner—William Powell
(74) Attorney, Agent, or Firm—Hayes, Soloway, Hennessey, Grossman & Hage, PC

(57) ABSTRACT

A method of manufacturing a semiconductor device comprises forming a composite film which is etched on a base substrate. The composite film includes nitrogen atoms but, at the surface portion thereof, does not substantially include nitrogen atoms. The method further comprises forming a chemically amplified photo resist film on the composite film, exposing the photo resist film according to predetermined patterns, developing the photo resist film to form a patterned resist film, and etching the composite film by using the patterned resist film as a mask. According to this method, deterioration of throughput can be avoided, and the phenomenon of deactivation of proton acid generated on the resist exposure can be suppressed even after long time storage or even when the reconstruction is required.

17 Claims, 3 Drawing Sheets

7. RESIST PATTERN

- 4. TiN FILM
- 3. Aℓ FILM
- 2. INTERLAYER FILM
- 1. Si SUBSTRATE

- 6. Ti FILM
- 5. TRANSITION REGION

- 7. RESIST PATTERN

METHOD FOR MANUFACTURING A SEMICONDUCTOR DEVICE

FIELD OF THE INVENTION

The present invention relates generally to a method of manufacturing semiconductor devices, and more particularly to a method of manufacturing semiconductor devices which includes a patterning process using chemically amplified photo resist.

BACKGROUND OF THE INVENTION

As semiconductor devices such as large-scale integrated circuit (LSI) devices and the like are highly integrated, it becomes necessary in these LSI devices to form finer inner conductors, electrodes and the like. For example, in case of a Dynamic Random Access Memory (DRAM), 64 Megabit DRAM uses 0.35 micrometer (micron) rule, and 256 Megabit DRAM of the next generation uses 0.25 micrometer rule. In order to deal with such needs of miniaturization, exposure light source having shorter wavelength is required in the field of lithography for forming LSI patterns. Therefore, recently, in place of a conventional mercury lamp having high energy level emission line spectrum of g-line (436 nm), i-line (365 nm) and the like, excimer lasers of KrF (248 nm), ArF (193 nm) and the like have been introduced.

When such excimer lasers are used, it is impossible to use conventional resist for i-line exposure because of low transmittance. Therefore, new material such as polyhydroxystyrene (PHS) is developed. Also, because of low illuminance of the excimer lasers, chemically amplified photo resist is developed which can realize the photo resist having high sensitivity. In the chemically amplified photo resist, when it is exposed to the light, proton acid (H+) is generated from photo acid generator in the photo resist. In case the chemically amplified photo resist is a positive type, the acid diffuses into the photo resist when the resist is heated after the exposure to the light and renders resist resin in exposed portions soluble in developer, thereby enabling patterns to be formed. In case the chemically amplified photo resist is a negative type, the acid acts as a catalyst for crosslinking reaction and renders exposed portions of the resist insoluble in developer to enable pattern formation.

On the other hand, as a material of electrical wirings and electrodes, metallic materials such as aluminum (Al) and the like having high reflectance are mainly used. However, when the photo resist is applied directly on such materials, there occurs a problem that formed patterns deform due to light reflection from the metallic materials. Therefore, in general, anti-reflection process was done by forming a film of titanium nitride and the like on the metallic materials. Also, when LOCOS oxidation is to be performed to form isolation regions between elements, it is necessary to deposit silicon nitride film or silicon oxynitride film only on regions not to be oxidized. To this end, the silicon nitride film or the silicon oxynitride film was formed on whole surface of a substrate, and, on such silicon nitride film or silicon oxynitride film, the photo resist was directly applied and exposed. However, lone pairs (lone electron pairs) exist in such materials having nitrogen atoms. Therefore, when the chemically amplified photo resist is applied on such materials and exposed by using the excimer laser of KrF and the like, the proton acid generated is captured or trapped by the lone electron pairs and acid deactivation occurs, thus it becomes impossible to form desired patterns appropriately. That is, when the positive type resist is used, so called "skirt trailing" phenomenon is generated wherein width of the bottom portion of an opening becomes narrower than that of the top portion, or regions which are to become openings are not completely penetrated and resist patterns are not separated and resolved. On the contrary, when the negative type photo resist is used, encroaching or ingrowing phenomenon occurs in which the section of the bottom portion of the opening becomes larger at the interface with grounding plane than other portion of the opening.

In order to solve these problems in using the chemically amplified photo resist, Japanese patent application No. 6-217555, filed on Sep. 12, 1994 in Japan (Japanese patent laid-open publication No. 8-83786, published on Mar. 26, 1996) discloses a pattern forming method, in which, after forming a silicon oxide layer or a silicon oxynitride layer on a silicon nitride layer, chemically amplified resist is applied, and then exposed and developed. In this publication, a method of oxidizing the surface of the silicon nitride layer, by using oxygen plasma, is also disclosed to form the silicon oxide layer or the silicon oxynitride layer on the surface of the silicon nitride layer. Also, a method is known in which wet processing is performed on the silicon nitride layer by using acid solution. However, in these method, since a new layer is stacked by using separate process or by using separate apparatus, or wet process or another apparatus is further required, there is a possibility that manufacturing process becomes complicated and throughput is deteriorated.

On the other hand, in Japanese patent application No. 8-64360 filed on Mar. 21, 1996 in Japan (Japanese patent laid-open publication No. 9-260246, published on Oct. 3, 1997) a technique is disclosed wherein by using a film forming apparatus in which a film forming chamber and an ashing chamber are adjacently disposed, ashing is performed continuously after forming a nitride film to form a chemically amplified resist film on the nitride film whose quality at the surface is improved or modified. In this publication, it is disclosed that by using this technique lone pairs at the surface of the nitride film can be vanished or decreased, thereby the phenomenon in which the proton acid generated at the exposure is consumed by the lone pairs can be avoided.

In usual manufacturing process, process of resist application and exposure is not always conducted soon after the formation of nitride film, but often conducted one through several days after the formation, for reasons of processing semiconductor wafers by the manufacturing lot. If the wafers are stored or left for a long time before exposure process, effect of surface modification will be deteriorated, even if the quality of the surface of the nitride film is modified as described in the above-mentioned Japanese patent laid-open publication No. 9-260246 and the like. Also, if resist patterns once formed do not satisfy the permissible precision limits of pattern size or pattern location, it is necessary to perform reconstruction wherein the resist is stripped off and another resist is again applied to the wafer, and then exposure and developing are performed. However, when the resist is stripped off, the effect of quality improvement by the plasma is damaged, and the effect is further deteriorated due to the long time storage as mentioned above.

Therefore, it is an object of the present invention to provide a method of manufacturing a semiconductor device in which, when patterns are formed by using the chemically amplified photo resist formed on a layer which is etched and which includes nitrogen atoms, photo resist patterns having superior sectional profile can be fabricated.

It is another object of the present invention to provide a method of manufacturing a semiconductor device in which, when patterns are formed by using the chemically amplified photo resist formed on a layer which is etched and which includes nitrogen atoms, skirt trailing phenomenon or encroaching phenomenon of the chemically amplified photo resist in a lithography process can be avoided.

It is another object of the present invention to provide a method of manufacturing a semiconductor device in which, when patterns are formed by using the chemically amplified photo resist formed on a layer which is etched and which includes nitrogen atoms, skirt trailing phenomenon or encroaching phenomenon of the chemically amplified photo resist in a lithography process can be avoided without complicating a manufacturing process and without deteriorating throughput.

It is still another object of the present invention to provide a method of manufacturing a semiconductor device in which, when patterns are formed by using the chemically amplified photo resist formed on a layer which is etched and which includes nitrogen atoms, phenomenon of deactivation of proton acid generated on the exposure of the chemically amplified photo resist can be suppressed without complicating a manufacturing process and without deteriorating throughput.

It is still another object of the present invention to provide a method of manufacturing a semiconductor device in which, when patterns are formed by using the chemically amplified photo resist formed on a layer which is etched and which includes nitrogen atoms, phenomenon of deactivation of proton acid generated on the exposure of the chemically amplified photo resist can be suppressed and skirt trailing phenomenon or encroaching phenomenon of the chemically amplified photo resist in a lithography process can be avoided, even if the storage time before photo resist processing becomes long or the reconstruction of the wafer becomes necessary.

SUMMARY OF THE INVENTION

As a result of diligent consideration on the above-mentioned problems, the inventors of this invention found that, when a film which is etched, for example, the titanium nitride film or the silicon nitride film, is to be formed, the above-mentioned problems can be solved by forming the film on condition that, substantially, nitrogen atoms are not included in the film at the final stage of film formation or when surface portion of the film is formed.

According to the present invention, there is provided a method for manufacturing a semiconductor device, comprising: providing a base substrate; forming a composite film which is etched and which includes nitrogen atoms on said base substrate, wherein composition ratio of nitrogen atoms near the upper surface of said composite film is substantially smaller than composition ratio of nitrogen atoms in other portion of said composite film; forming a chemically amplified photo resist film on said composite film; exposing said chemically amplified photo resist film selectively according to predetermined patterns; developing and patterning said chemically amplified photo resist film exposed; and etching at least said composite film by using said chemically amplified photo resist film patterned as a mask.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1A:
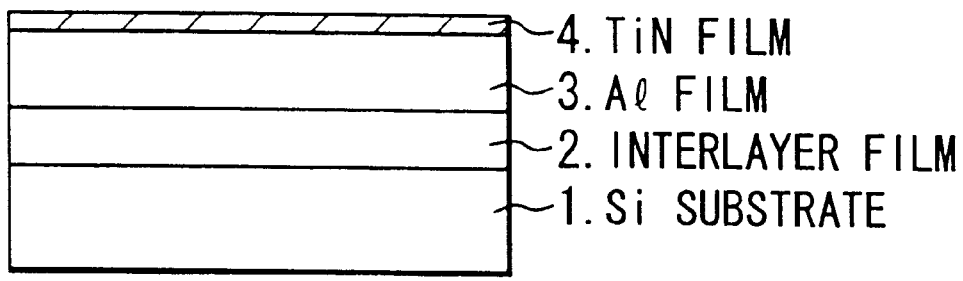
FIGS. 1A through 1C are schematic partial cross-sectional views of a portion of a semiconductor device substrate illustrating a method of forming a composite film which is etched and which includes nitrogen atoms in accordance with an embodiment of the present invention.

In the present invention, when a composite film which is etched and which includes nitrogen atoms is formed, the film is formed such that nitrogen atoms are substantially not included at the surface on which a chemically amplified photo resist is formed in etching process thereafter. Thereby, capturing or trapping, by lone pairs of the nitrogen atoms, of the proton acid generated in the chemically amplified photo resist by exposure can be suppressed.

Especially, in one embodiment of the present invention, a region including nitrogen atoms and a region not including nitrogen atoms are coupled via a transition region whose composition ratio of the nitrogen atoms in the film is, for example, gradually decreased, so that adhesion of both regions can be increased. Therefore, especially, the film having superior reconstruction characteristic can be formed. These region including nitrogen atoms and region not including nitrogen atoms as well as the transition region formed therebetween can be formed by gradually decreasing the quantity of introduction of nitride gas such as NH3 or N2 introduced into a chamber as nitrogen source when nitride film is formed by, for example, plasma CVD method and the like. Therefore, it is possible to form these regions within the same chamber and deterioration of the throughput can be avoided.

In the present invention, nitrogen content in the composite film which is etched is controlled such that, substantially, nitrogen atoms are not included at the surface on which the chemically amplified resist is applied. The region in which nitrogen atom is not included should have a thickness equal to or larger than 5 nm to prevent acid deactivation which occurs due to the capturing of the proton acid by the lone pairs and to attain the advantageous effect of the present invention. The upper limit of the thickness is not particularly limited but can be any convenient value. However, when the composite film which is etched is used as a film which should attain its inherent function, for example, as an anti-reflection film, the region not including nitrogen may be formed approximately up to the thickness in which effect of anti-reflection is not damaged. When the composition ratio of nitrogen in the composite film is gradually decreased, the composition ratio of nitrogen can be continuously decreased or can be decreased stepwise. Also, it is possible to, at the initial time, start film formation without introducing nitrogen source, then to gradually increase quantity of nitrogen introduction, and thereafter to decrease the quantity of nitrogen introduction.

Further, according to the present invention, it is also possible to thermally oxidize a region of the resist coating surface which do not substantially include nitrogen atoms in oxidizing ambient and to form oxidized film at the surface. Also, while decreasing the composition ratio of nitrogen atoms, oxidizing gas can be introduced into film forming ambient so that oxygen atoms are included in the film to form oxide film at the surface.

EXAMPLES

The present invention will now be explained concretely with reference to examples. However, it should be noted that the present invention is not limited to these examples.

Example 1

Figure 1B:
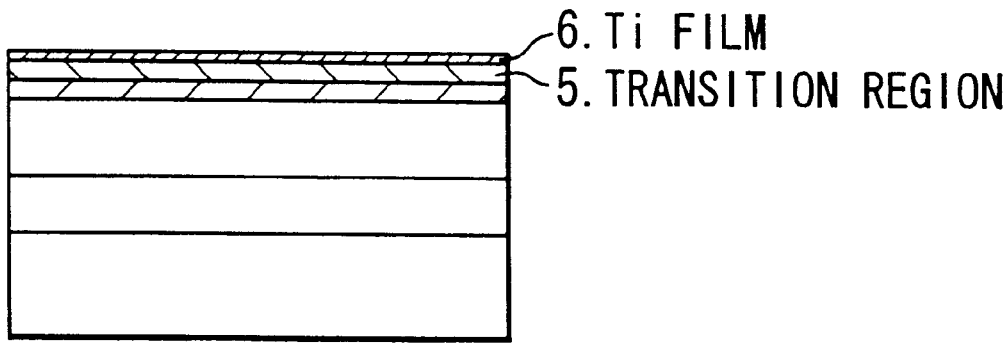

With reference to the partial schematic cross-sectional views of FIGS. 1A through 1C, a process according to this example will now be described. A semiconductor substrate, such as a Si (silicon) substrate 1 was prepared. On the Si substrate 1, an interlayer film 2, such as SiO2 and the like, and aluminum layer 3 were sequentially formed, thereby a base substrate was provided. It should be noted that the base substrate is not limited to the substrate having such constitution, but can be any substrate on which a composite film that is etched and that includes nitrogen atoms at least partially is formed. On the aluminum layer 3, a composite film including TiN film 4 (FIG. 1A) which is etched was formed by DC magnetron sputtering method using a Ti target on the following conditions.

RF power: 5 KW

Degree of vacuum: 4 mTorr

Flow rate of argon (Ar) gas: 20 sccm

Flow rate of nitrogen (N2) gas: 20–0 sccm

Thickness of film formed: 30 nm

In this process, the composite film was formed by gradually decreasing flow rate of nitrogen gas, and at the final stage nitrogen gas was not introduced. That is, as shown in FIG. 1B, the flow rate of nitrogen gas was adjusted so that TiN film 4 was formed from the beginning of film formation to the thickness of 10 nm, a transition region 5 from TiN to Ti was formed to the additional thickness of 10 nm on the TiN film 4, and Ti film 6 was formed in the remaining thickness of 10 nm on the transition region 5. The composite film thus can be fabricated continuously in one process by adjusting gas flow rate during film formation. Therefore, manufacturing process of the composite film does not become complicated.

Then, positive type chemically amplified photo resist film was applied on the composite film to be etched and formed as mentioned above, and pattern exposure was conducted by selectively radiating exposure light of KrF excimer laser (248 nm) thereon. Thereafter, heat treatment and developing process was conducted as is well known in the art to remove exposed portions of the photo resist. It should be noted that the application of the photo resist may be done, for example, after leaving or storing the semiconductor substrate 4 or 5 days from the time the composite film was formed.

Figure 1C:
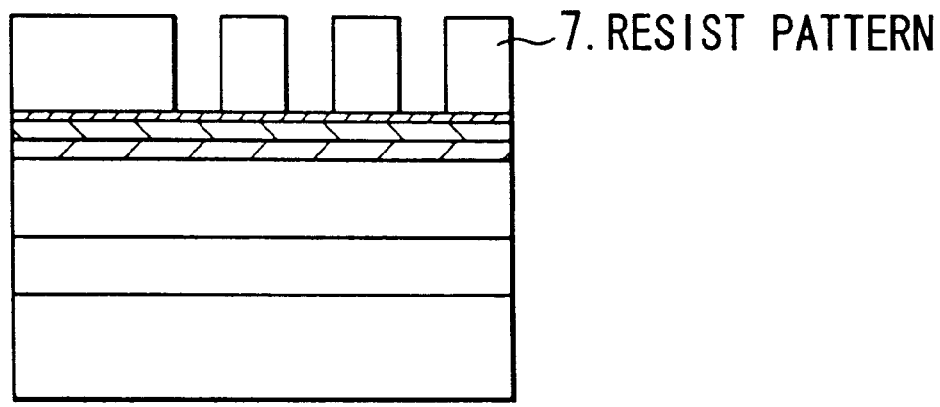

When the shape of a cross-section of resist patterns 7 formed as mentioned above was observed by a microscope, skirt trailing phenomenon in which width of the bottom portion of an opening becomes narrower than that of the top portion was hardly observed, and satisfactory patterns were formed as shown in FIG. 1C.

Thereafter, the resist patterns formed as mentioned above were removed, and application of resist, exposure and developing thereof were conducted again. However, the skirt trailing phenomenon did not occur. Further, such reconstruction was repeated several times, but satisfactory resist patterns were formed similarly.

By using the resist patterns having such superior sectional profile to perform etching of the composite film (TiN film 4, transition region 5 and Ti film 6) and the aluminum film 3, it is possible to form wiring patterns or electrode patterns precisely in predetermined locations and in predetermined sizes.

In the above explanation, the constitution in which the TiN to Ti transition region was formed between the TiN film and the Ti film was described. However, it is possible to obtain the same effect by using a constitution in which such transition region or area is not formed but the TiN film shifts directly into the Ti film. For example, after forming TiN film by the thickness of 20 nm, supply of nitrogen gas was stopped and the chamber was once evacuated. Thereafter, the Ti film is formed by the thickness of 10 nm on the TiN film, to obtain the similar effect.

In this process, it is possible to decrease applied RF power before stopping supply of nitrogen gas into the chamber and restore to a predetermined power after the evacuation, so that shift of film formation from TiN film to Ti film can be done without forming the transition region therebetween. Also, in this case, it is possible, without carrying out the above-mentioned evacuation, to perform film formation continuously even after consumption of nitrogen gas remaining in the chamber. As a result of this process, the transition region from TiN to Ti is slightly formed, but similar effect can be obtained also in this case.

Figure 2:
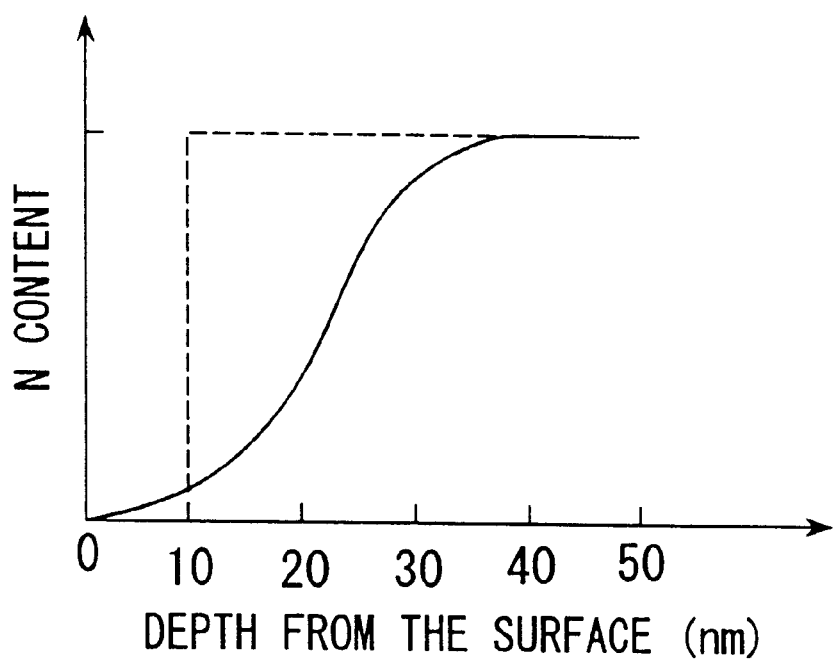
FIG. 2 is a graph showing an example of a characteristic of nitrogen composition ratio in a composite film which is decreased continuously or stepwise from TiN film to Ti film in a process of film formation.

When, as mentioned in the above example, the composite film is formed as an anti-reflection film on the aluminum conductor, the thickness of the composite film is approximately 25 through 50 nm. For example, when the composite film is formed by the thickness of 50 nm, as shown in FIG. 2, the TiN film 4 is formed from the beginning of the TiN film formation to the thickness of approximately 20–30 nm, and thereafter the composition ratio of nitrogen atoms is continuously decreased. Finally, it becomes possible to form Ti film 6 that does not include nitrogen atoms near the upper surface (in the drawing, approximately 5 nm).

When the TiN - Ti transition region is not formed, for example, when, after the TiN film is formed, supply of nitrogen gas is stopped and the chamber is once evacuated to form the Ti film in an argon ambient, it is possible to form the TiN film of approximately 40 nm thick and the Ti film of approximately 10 nm thick continuously as shown by the dotted line of FIG. 2.

Example 2

Figure 3:
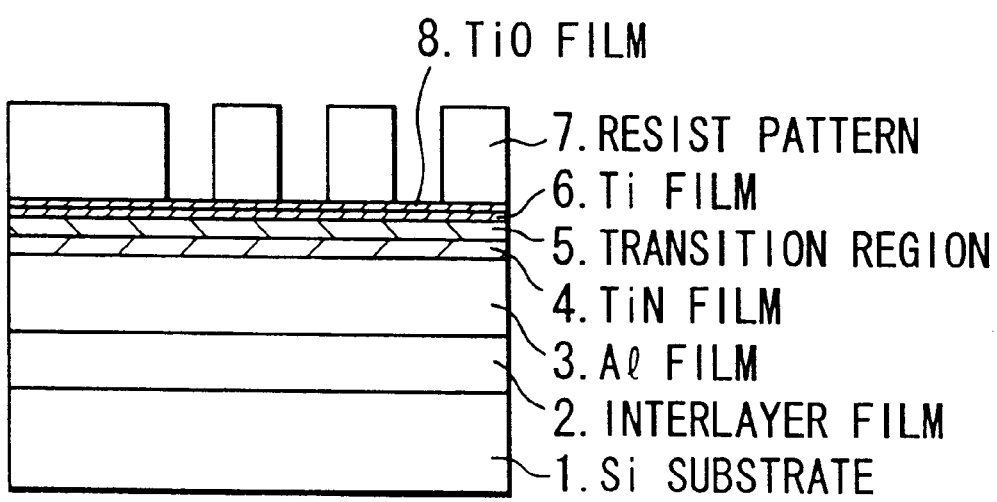
FIG. 3 is a schematic partial cross-sectional view of a portion of a semiconductor device substrate illustrating a second embodiment of the present invention.

In the Example 1, after forming the composite film, the surface of the film was thermally oxidized by using heat treatment method by an electric furnace. In this case, the heat treatment was conducted in the atmosphere for 5 minutes at 500 degrees Celsius of heat treatment temperature. Thereby, as shown in FIG. 3, the TiN film 6 was thermally oxidized from the surface to the thickness of 5 nm and thereby TiO2 film 8 was formed. As is known in the art, a Ti film is oxidized by the thickness of several nanometers when it is taken out after sputtering from the film forming chamber at room temperature and only exposed to air, and TiOx is formed thereby. The TiOx thus formed has oxygen composition smaller than stoichiometric value of 2 and is easily delaminated. However, when the TiO2 film is formed as mentioned above by thermal oxidation, robust film can be formed, which film has superior characteristic in the reconstruction of the photo resist. Thereafter, chemically amplified photo resist coating, exposure and developing were conducted similarly, and satisfactory resist patterns were formed as in the Example 1. Also, reconstruction of the photo resist was repeated several times as in the Example 1, but deterioration of the photo resist patterns was hardly observed.

Example 3

Figure 4:
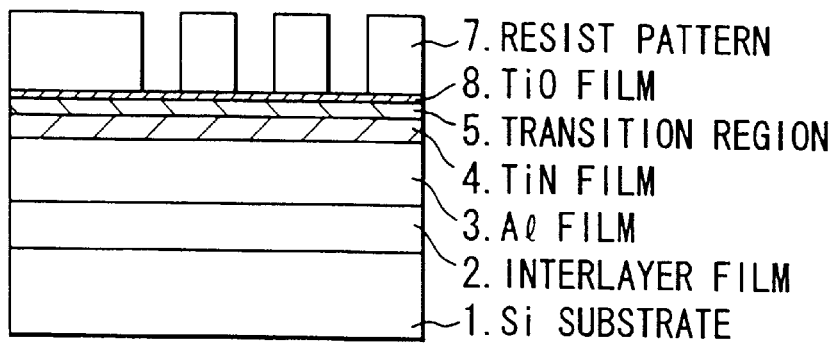
FIG. 4 is a schematic partial cross-sectional view of a portion of a semiconductor device substrate illustrating a third embodiment of the present invention.

In the process similar to the Example 1, at the final stage of the composite film formation, the composite film was formed while introducing oxygen gas into the chamber, without introducing nitrogen gas. Consequently, TiO film 8 was formed by the thickness of 10 nm on the TiN film 4 and the transition region 5, as shown in FIG. 4. In this case, the film was formed by introducing oxygen at a flow rate of 20 sccm. Thereafter, chemically amplified photo resist coating, exposure and developing were conducted similarly, and satisfactory resist patterns were formed as in the Example 1. Also, reconstruction of the photo resist was repeated several times as in the Example 1, but deterioration of the photo resist patterns was hardly observed.

Example 4

Figure 5:
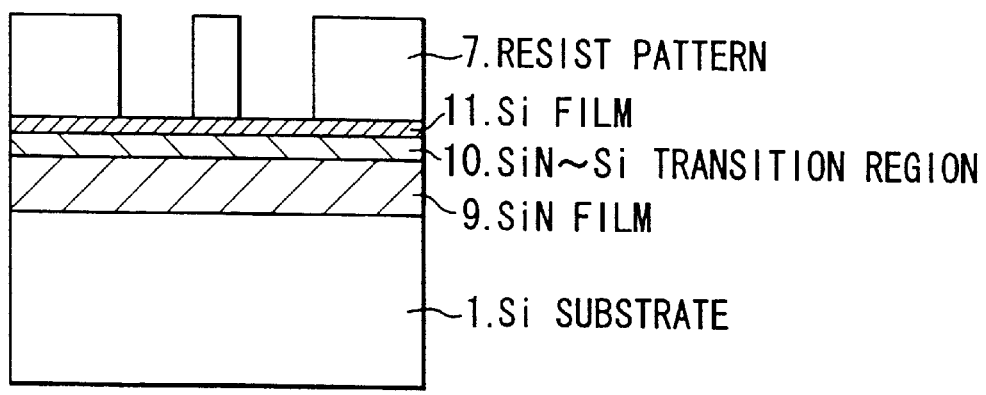
FIG. 5 is a schematic partial cross-sectional view of a portion of a semiconductor device substrate illustrating a fourth embodiment of the present invention.

With reference to FIG. 5, explanation will be made on an example of forming a composite film including SiN film which is etched on a silicon substrate as an example of a base subtrate, in order to form an oxide film used for LOCOS isolation. In this example, the composite film was formed by using plasma CVD method. The conditions thereof were as shown below.

Microwave power: 1 KW
Degree of vacuum: 5 Torr
Temperature of substrate: 400 degrees Celcius
Flow rate of silane (SiH4) gas: 350 sccm
Flow rate of ammonia (NH3) gas: 150 sccm
Flow rate of nitrogen (N2) gas: 5000 sccm
Film thickness formed: 200 nm When forming the composite film, quantity of introduction of ammonia gas and nitrogen gas as nitrogen sources was gradually decreased, and at the final stage, nitrogen sources were not introduced. Consequently, SiN film 9 of 160 nm thick, SiN through Si transition region 10 of 30 nm thick, and Si film 11 of 10 nm thick were formed. It is also possible to stop introduction of nitrogen source after forming SiN film to a predetermined thickness, and thereafter to evacuate the chamber and to introduce silane gas into the chamber, such that Si film (10 nm) is formed after SiN film (190 nm). Thereafter, chemically amplified photo resist coating, exposure and developing were conducted similarly, and satisfactory resist patterns were formed as in the Example 1. Also, reconstruction of the photo resist was repeated several times as in the Example 1, but deterioration of the photo resist patterns was hardly observed.

By using the resist patterns having such superior sectional profile to perform etching of the composite film (SiN film 9, transition region 10 and Si film 11), it is possible to pattern the composite film precisely in predetermined locations and in predetermined sizes. After removing the photo resist patterns by ashing and the like, the silicon substrate 1 is selectively oxidized by using the composite film patterns as a mask, and thereby oxide film for LOCOS isolation can be formed precisely in predetermined locations and in predetermined sizes on the silicon substrate 1.

When the SiN film is formed for making the oxide film used for LOCOS isolation, the film is usually formed by the thickness of 100 through 300 nm.

Example 5

Figure 6:
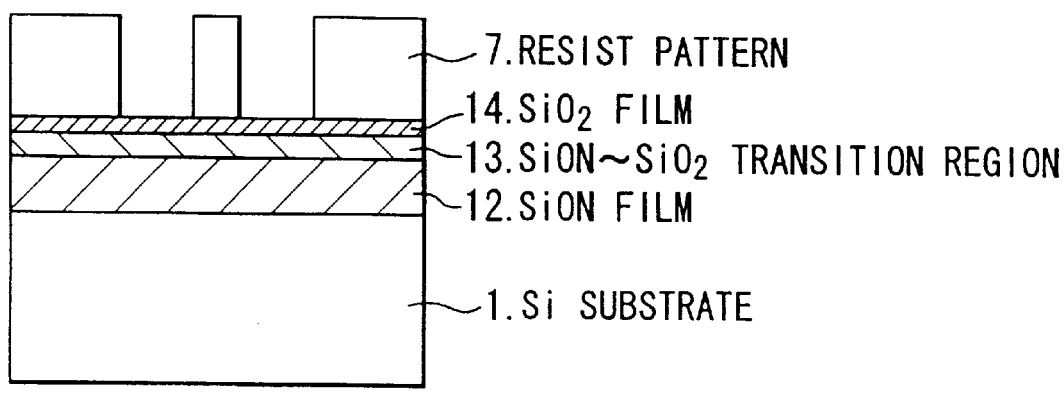
FIG. 6 is a schematic partial cross-sectional view of a portion of a semiconductor device substrate illustrating a fifth embodiment of the present invention.

This example will be explained with reference to FIG. 6. When the composite film was formed in a manner similar to the Example 4, the flow rate of silane gas (SiH$_4$) was changed to 200 sccm. Also, in addition to the ammonia gas and nitrogen gas, dinitrogen oxide gas (N$_2$O) was used at a flow rate of 100 sccm, to form silicon oxynitride film. As in the Example 4, when forming the film, quantity of introduction of ammonia gas and nitrogen gas as nitrogen sources was gradually decreased, and at the final stage, these gases were not introduced. Consequently, as shown in FIG. 6, SiON film 12 of 160 nm thick, SiON through SiO$_2$ transition region 13 of 30 nm thick, and SiO$_2$ film 14 of 10 nm thick were formed. It is also possible to stop introduction of ammonia gas and nitrogen gas after forming SiON film to a predetermined thickness, and thereafter to evacuate the chamber and to introduce silane gas into the chamber, such that SiO$_2$ film (10 nm) is formed after SiON film (190 nm). Thereafter, chemically amplified photo resist coating, exposure and developing were conducted similarly, and satisfactory resist patterns were formed as in the Example 1. Also, reconstruction of the photo resist was repeated several times as in the Example 1, but deterioration of the photo resist patterns was hardly observed.

In the above-mentioned examples, formation of the composite film was conducted by using, for example, the magnetron sputtering method and the plasma CVD method. However, the present invention is not limited to using these methods, but film formation can be done by using other known methods in which introduction of nitrogen source is independently controlled, for example, thermal CVD method, vacuum evaporation, MBE method, and the like.

Also, in the above explanation, examples using positive type photo resist were described. However, the present invention can also attain advantageous effects when negative type photo resist was used.

As mentioned above, according to the present invention, when patterns are formed by using chemically amplified photo resist formed on the composite film which is etched and which includes nitrogen atoms, deterioration of throughput can be avoided, and the phenomenon of deactivation of proton acid generated on the resist exposure can be suppressed even when storing time from the formation of the composite film to resist processing becomes long or when the reconstruction is required.

In the foregoing specification, the invention has been described with reference to specific embodiments. However, one of ordinary skill in the art appreciates that various modifications and changes can be made without departing from the scope of the present invention as set forth in the claims below. For example, the above-mentioned composite film can be constituted only by a transition region wherein composition ratio of nitrogen gradually increases from the bottom to the top surface of the composite film. Accordingly, the specification and figures are to be regarded in an illustrative sense rather than a restrictive sense, and all such modifications are intended to be included within the scope of the present invention. Therefore, it is intended that this invention encompasses all of the variations and modifications as fall within the scope of the appended claims.

What is claimed is:

1. A method for manufacturing a semiconductor device, comprising:

providing a base substrate;

forming a composite film which is etched and which includes nitrogen atoms on said base substrate, wherein composition ratio of nitrogen atoms near the upper surface of said composite film is substantially smaller than composition ratio of nitrogen atoms in other portion of said composite film;

forming a chemically amplified photo resist film on said composite film;

exposing said chemically amplified photo resist film selectively according to patterns;

developing and patterning said chemically amplified photo resist film exposed; and etching at least said composite film by using said chemically amplified photo resist film patterned as a mask.

2. The method for manufacturing a semiconductor device as set forth in claim 1, wherein said composite film is formed continuously in one process.

3. The method for manufacturing a semiconductor device as set forth in claim 1, wherein, in said forming a composite film, said composite film is formed in the condition in which nitrogen atoms are not introduced into said composite film at the final stage of forming said composite film.

4. The method for manufacturing a semiconductor device as set forth in claim 1, wherein, in said forming a composite film, said composite film is formed in the condition in which nitrogen source does not exist in a film forming ambient at the final stage of forming said composite film.

5. The method for manufacturing a semiconductor device as set forth in claim 1, wherein, in said forming a composite film, said composite film is formed by gradually decreasing the quantity of introduction of nitrogen atoms into said composite film, from the beginning of forming said composite film to the final stage of forming said composite film.

6. The method for manufacturing a semiconductor device as set forth in claim 1, wherein, in said forming a composite film, said composite film is formed by gradually decreasing the quantity of nitrogen source in a film forming ambient, from the beginning of forming said composite film to the final stage of forming said composite film.

7. The method for manufacturing a semiconductor device as set forth in claim 1, wherein, in said forming a composite film, said composite film is formed by introducing a quantity of nitrogen atoms into said composite film and by stopping introduction of nitrogen atoms into said composite film at the final stage of forming said composite film.

8. The method for manufacturing a semiconductor device as set forth in claim 1, wherein, in said forming a composite film, said composite film is formed by introducing a quantity of nitrogen source into a film forming ambient and by stopping introduction of nitrogen source into the film forming ambient at the final stage of forming said composite film.

9. The method for manufacturing a semiconductor device as set forth in claim 1, wherein said base substrate includes a film region of metallic material, said composite film being formed on said film region of metallic material.

10. The method for manufacturing a semiconductor device as set forth in claim 1, wherein said composite film includes a titanium nitride film region.

11. The method for manufacturing a semiconductor device as set forth in claim 10, wherein a region near the upper surface of said composite film comprises a titanium film region that does not substantially include nitrogen atoms.

12. The method for manufacturing a semiconductor device as set forth in claim 1, wherein said composite film includes a silicon nitride film region.

13. The method for manufacturing a semiconductor device as set forth in claim 12, wherein a region near the upper surface of said composite film comprises a silicon film region that does not substantially include nitrogen atoms.

14. The method for manufacturing a semiconductor device as set forth in claim 1, wherein said composite film includes a silicon oxynitride film region.

15. The method for manufacturing a semiconductor device as set forth in claim 14, wherein a region near the upper surface of said composite film comprises a silicon oxide film region that does not substantially include nitrogen atoms.

16. The method for manufacturing a semiconductor device as set forth in claim 1, wherein said method further comprises heat treating said composite film in an oxidization ambient, after forming said composite film, said chemically amplified photo resist film being formed on said composite film which is heat treated by said heat treating.

17. The method for manufacturing a semiconductor device as set forth in claim 1, wherein, in said forming a composite film, oxygen source is introduced into a film forming ambient at the final stage of forming said composite film.

* * * * *